(12) United States Patent
Maruhashi et al.

(10) Patent No.: US 6,437,654 B2
(45) Date of Patent: *Aug. 20, 2002

(54) SUBSTRATE-TYPE NON-RECIPROCAL CIRCUIT ELEMENT AND INTEGRATED CIRCUIT HAVING MULTIPLE GROUND SURFACE ELECTRODES AND CO-PLANAR ELECTRICAL INTERFACE

(75) Inventors: Kenichi Maruhashi; Keiichi Ohata, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,692

(22) Filed: Nov. 19, 1998

(30) Foreign Application Priority Data

Nov. 19, 1997 (JP) .............................. 9-318621

(51) Int. Cl.$^7$ .............................. H01P 1/387; H01P 1/36
(52) U.S. Cl. ........................................ 333/1.1; 333/24.2
(58) Field of Search .................................. 333/1.1, 24.2

(56) References Cited

U.S. PATENT DOCUMENTS

| 4,920,323 | A | * | 4/1990 | Schloemann et al. ......... 333/1.1 |
| 5,419,947 | A | | 5/1995 | Dejima et al. ............ 333/1.1 X |
| 5,528,203 | A | * | 6/1996 | Mohwinkel et al. ..... 333/247 X |
| 5,783,847 | A | * | 7/1998 | Tzuang ........................ 257/275 |
| 5,886,587 | A | * | 3/1999 | Sturdivant ................... 333/1.1 |

FOREIGN PATENT DOCUMENTS

| DE | OS 21 52 108 | 4/1972 |
| GB | 1359 175 | 7/1974 |
| GB | 2 040 593 A | 8/1980 |
| JP | 47-1735 | 1/1972 |
| JP | 47-8709 | 5/1972 |
| JP | 55-130156 | 10/1980 |
| JP | 58-201403 | 11/1983 |

(List continued on next page.)

OTHER PUBLICATIONS

Japanese Office Action dated Nov. 30, 1999, with partial translation.
Japanese Office Action dated Aug. 1, 2000, with partial translation.
Schloemann, E, "Circulators for Microwave and Millimeter–Wave Integrated Circuits," Proc. IEEE, vol. 78, No. 2, 1988, pp. 188–200.
German Office Action dated Dec. 19, 2000 with English translation.

*Primary Examiner*—Justin P. Bettendorf
(74) *Attorney, Agent, or Firm*—McGinn & Gibb, PLLC

(57) ABSTRACT

A substrate-type non-reciprocal circuit element comprises a substrate, a ferrite embedded in the substrate, a central electrode formed on the ferrite at one principal surface of the substrate, a plurality of signal conductors formed on the one principal surface of the substrate to extend from the central electrode into a plurality of different outward directions, a first ground electrode formed on the one principal surface of the substrate, separately from the central electrode and the plurality of signal conductors, and a second ground electrode formed on the other principal surface of the substrate and electrically connected to the first ground electrode. Thus, the substrate-type non-reciprocal circuit element can be easily electrically connected to a measurement machine, to enable to precisely and easily measure an electrical characteristics with a good repeatability. In addition, the substrate-type non-reciprocal circuit element can be connected to an electric circuit such as a receiver circuit and a transmitter circuit with a low transmission loss and a low variation in the transmission loss.

27 Claims, 7 Drawing Sheets

FOREIGN PATENT DOCUMENTS

| | | |
|---|---|---|
| JP | 59-8403 | 1/1984 |
| JP | 61-288486 | 12/1986 |
| JP | 61-293001 | 12/1986 |
| JP | 1-129502 | 5/1989 |
| JP | 1-149107 | 10/1989 |
| JP | 6-268414 * 9/1994 | ................ 333/1.1 |
| JP | 7-16401 | 3/1995 |
| JP | 8-51303 | 2/1996 |
| JP | 8-204408 | 8/1996 |
| JP | 8-316368 | 11/1996 |

* cited by examiner

SUBSTRATE-TYPE NON-RECIPROCAL CIRCUIT ELEMENT AND INTEGRATED CIRCUIT HAVING MULTIPLE GROUND SURFACE ELECTRODES AND CO-PLANAR ELECTRICAL INTERFACE

BACKGROUND OF THE INVENTION

1. Field of the Invention

The present invention relates to a substrate-type non-reciprocal circuit element and an integrated circuit using the same, and more specifically to a substrate-type non-reciprocal circuit element, such as a circulator and an isolator, suitably used in a high frequency circuit, and an integrated circuit using the same.

2. Description of Related Art

One example of a prior art non-reciprocal circuit element is disclosed in U.S. Pat. No. 5,419,947, the content of which is incorporated by reference in its entirety into this application. Of the non-reciprocal circuit element, one example of the substrate-type non-reciprocal circuit element is shown in FIG. 7 which is a diagrammatic perspective view illustrating a substrate-type circulator, which is one example of a three-terminal circulator.

This substrate-type circulator includes a substrate 1 and a ferrite 2 embedded in the substrate 1. A central electrode pattern 3 is formed on an upper surface of the ferrite 2, and lead-out conductors (signal conductors) 4 are formed on an upper surface (or one principal surface) 1a of the substrate 1 to extend from the central electrode pattern 3 in three different radially-outward directions. A ground electrode 5 is formed on a lower surface (or the other principal surface) of the substrate 1.

This substrate-type circulator is put on a carrier member and is conveyed in that condition, and thereafter mounted on a circuit board. For example, when the substrate-type circulator is connected to a transceiver circuit board (device), the respective lead-out conductors 4, which constitute connection terminals, are connected to corresponding electrodes on the circuit board by means of a wire bonding or another.

In an actual operation, it is an ordinary practice to position a magnet (not shown) above the ferrite 2. Thus, this substrate-type circulator has such a non-reciprocal feature that a signal applied to one lead-out conductor 4 is never returned to the same lead-out conductor 4 but is outputted from another lead-out conductor 4.

Here, if one terminal of the substrate-type circulator is terminated with a matching load, the substrate-type circulator can be converted into a substrate-type non-reciprocal circuit element having a function as an isolator.

For example, the above mentioned substrate-type circulator can be operated as an isolator, if one lead-out conductor 4 is grounded through a reflectionless resistor. In this case, the reflectionless resistor can be obtained by forming a thin film resistor on the substrate 1. In the thin film resistor, however, it is generally difficult to precisely control the resistance, and therefore, the resistance of the thin film resistor is adjusted by a trimming such as a laser trimming.

In the prior art substrate-type circulator, variation of the size inevitably occurs in a manufacturing process, for example, in a process for embedding the ferrite 2 into the substrate 1, and in a process for forming the central electrode pattern 3. As a result, the high frequency characteristics of the circulator varies, and therefore, it was necessary to conduct a sorting with reference to an appearance and an electric characteristics.

In the case of this substrate-type circulator, since the variation of the size gives a large influence to a high frequency characteristics in a very high frequency region such as a millimeter wave band, it is necessary to adopt a reliable characteristic evaluation method for the sorting.

In this very high frequency region, on the other hand, it is not so easy to realize a good electrical connection between the substrate-type circulator before the mounting and a characteristic evaluation machine, and therefore, it is difficult to precisely conduct a large amount of sorting. Even if there is used a test fixture so configured to catch the substrate 1 between a pair of members so as to cause the terminals of the circulator, namely, the lead-out conductors 4 to be pressure-connected to connector terminals, it is difficult to measure a large number of substrate-type circulators in the millimeter wave band with a good repeatability.

In addition, when the lead-out conductors 4 are connected to electrodes of the circuit board by means of the wire bonding, the wiring length becomes as long as about 100 $\mu$m to 500 $\mu$m because of a mounting margin of the circuit board. Furthermore, because of a restriction in the mounting precision, it is difficult to maintain the length of the wire at a constant value. In the very high frequency region such as the millimeter wave band, therefore, a reflection loss attributable to an inductance of the wire and variation in the inductance of the wire give a large influence to a transmission characteristics, with the result that it was difficult to connect between the transceiver circuit and the substrate-type circulator with a low loss and with a small variation in the loss.

This problem is also true in the case that the substrate-type circulator is used as the isolator.

Furthermore, when the substrate-type circulator is used as the isolator, it is also difficult to surely evaluate the electric characteristics of the isolator in the very high frequency region such as the millimeter wave band, similarly to the circulator. In addition, it was difficult to evaluate and to adjust the thin film resistor.

Therefore, there is a strong demand to perform the evaluation of the electric characteristics and the evaluation and the adjustment of the thin film resistor, before the mounting, by a means having a very simple construction.

SUMMARY OF THE INVENTION

Accordingly, it is an object of the present invention to provide a substrate-type non-reciprocal circuit element which has overcome the above mentioned problems of the prior art.

Another object of the present invention is to provide a substrate-type non-reciprocal circuit element, enabling to easily measure the electric characteristics of the substrate-type non-reciprocal circuit element with a high precision and a high repeatability, thereby to easily and precisely perform the sorting before the mounting.

Still another object of the present invention is to provide a substrate-type non-reciprocal circuit element, enabling to electrically connect the substrate-type non-reciprocal circuit element on a circuit board such as a transceiver circuit board, with a small loss and with a small variation in the loss.

A further object of the present invention is to provide an integrated circuit incorporating therein a substrate-type non-reciprocal circuit element.

The above and other objects of the present invention are achieved in accordance with the present invention by a substrate-type non-reciprocal circuit element having a plurality of signal conductors and so configured that a signal inputted through one signal conductor is outputted from another signal conductor, the substrate-type non-reciprocal circuit element comprising a substrate, a ferrite embedded in the substrate, a central electrode formed on the ferrite at one principal surface of the substrate, a plurality of signal conductors formed on the one principal surface of the substrate to extend from the central electrode into a plurality of different outward directions, and a first ground electrode formed on the one principal surface of the substrate, separately from the central electrode and the plurality of signal conductors.

Specifically, the first ground electrode is formed at opposite sides of each of the signal conductors, separately from each of the signal conductors, so as to form a coplanar waveguide between each of the signal conductors and the first ground electrode.

In one embodiment, a reflectionless resistor is located at the side of the one principal surface of the substrate and is connected between one of the signal conductors and the first ground electrode.

Preferably, a second ground electrode is formed on the other principal surface of the substrate and is electrically connected to the first ground electrode. This second ground electrode can be electrically connected to the first ground electrode by a side surface electrode formed on a side surface of the substrate or by through-holes formed to penetrate through the substrate from the first ground electrode to the second ground electrode.

According to another aspect of the present invention, there is provided an integrated circuit comprising an integrated circuit board and the substrate-type non-reciprocal circuit element as mentioned above, the substrate-type non-reciprocal circuit element being electrically connected to the integrated circuit board in a flip chip method.

In one embodiment, the substrate-type non-reciprocal circuit element is accommodated in a recess formed in the integrated circuit board.

In the above mentioned substrate-type non-reciprocal circuit element in accordance with the present invention, since the plurality of signal conductors extending from the central electrode in the plurality of different directions and the first ground electrode are formed on the one principal surface of the substrate, if a probe having a plurality of contacting terminals located in the same plane is used, it is possible to realize a good electrical contact between the probe and the substrate-type non-reciprocal circuit element in a very high frequency region such as the millimeter wave band.

Therefore, the substrate-type non-reciprocal circuit element can be easily electrically connected to a measurement machine, whereby an electrical characteristics can be precisely and easily measured with a good repeatability.

In addition, since the plurality of signal conductors extending from the central electrode in the plurality of different directions and the first ground electrode are formed on one principal surface of the substrate, the substrate-type non-reciprocal circuit element is simple in construction.

Furthermore, in the integrated circuit mentioned above in accordance with the present invention, since the signal conductors and the ground electrode are formed on the same principal surface of the substrate of the substrate-type non-reciprocal circuit element, the signal conductors and the ground electrode of the substrate-type non-reciprocal circuit element can be connected to signal conductors and a ground electrode of a coplanar waveguide formed on the integrated circuit board, respectively, by means of the bumps with an extremely short connection distance. Therefore, when the substrate-type non-reciprocal circuit element is connected to an electric circuit such as the receiver circuit and the transmitter circuit, the transmission loss itself and the variation in the transmission loss can be minimized.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the substrate-type non-reciprocal circuit element in accordance with the present invention and the integrated circuit in accordance with the present invention will be described with reference to the drawings.

First Embodiment

Figure 1:
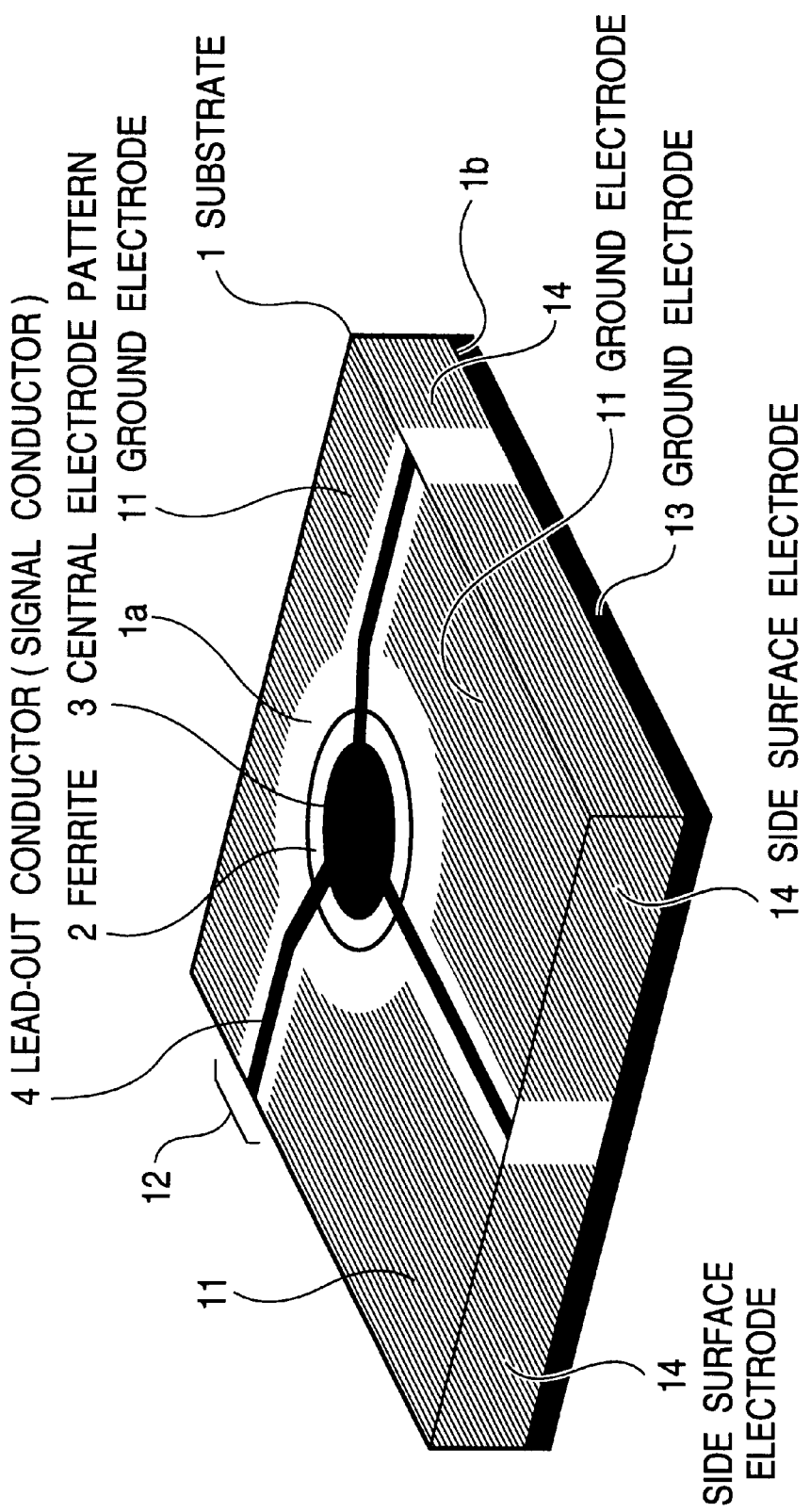
FIG. 1 is a diagrammatic perspective view of a substrate-type circulator which is a first embodiment of the substrate-type non-reciprocal circuit element in accordance with the present invention.

Referring to FIG. 1, there is shown a diagrammatic perspective view of a substrate-type circulator which is a first embodiment of the substrate-type non-reciprocal circuit element in accordance with the present invention. The shown substrate-type circulator includes a substrate 1 formed of a dielectric material and a ferrite 2 in the form of a circular cylinder embedded in the substrate 1. An central electrode pattern 3 is formed on an upper surface of the ferrite 2 which is coplanar with an upper surface (namely, one principal surface) of the substrate 1. In addition, a plurality of lead-out conductors (signal conductors) 4 are formed on the upper surface 1a of the substrate 1 to extend from the central electrode pattern 3 in a plurality of radially outward directions. In the shown embodiment, the lead-out conductors 4 are formed to extend in three different directions, so that a three-terminal circulator is constituted.

Furthermore, first ground electrodes 11 are formed on the upper surface 1a of the substrate 1 to surround the central electrode pattern 3 and to be positioned at opposite sides of each of the lead-out conductors 4, but separately from the central electrode pattern 3 and the lead-out conductors 4, so that a coplanar waveguide 12 (which is one kind of surface strip transmission line) is constituted of the lead-out conductors 4 and the first ground electrodes 11 at the opposite sides of each of the lead-out conductors 4. The first ground electrodes 11 are electrically connected to a second ground electrode 13 formed on a lower surface (or the other principal surface) 1b of the substrate 1 through side surface electrodes 14 formed on a side surface of the substrate 1.

In order to evaluate the electric characteristics of this substrate-type circulator, for example, a coplanar type high frequency probe can be used which includes a plurality of pins located in the same plane in the order of a ground pin, a signal pin and a ground pin. This coplanar type high frequency probe is applied to the substrate-type circulator in such a manner that the ground pin, the signal pin and the ground pin of the coplanar type high frequency probe are brought into contact with the first ground electrode 11, the lead-out conductor 4 and the first ground electrode 11 of the coplanar waveguide 12, respectively. In this condition, a good electrical connection can be realized between the substrate-type circulator and a characteristics evaluation machine connected to the high frequency probe, in a very high frequency region such as a millimeter wave band. This becomes possible by forming the lead-out conductors 4 and the ground plane (the first ground electrodes 11 in this first embodiment) in the same plane so that the coplanar type high frequency probe can be contacted to the lead-out conductors 4 and the ground plane of the substrate-type circulator simultaneously.

For example, if the substrate-type circulator of this embodiment is fixed on a sample stage by action of suction and the electric characteristics is measured and evaluated by contacting the coplanar type high frequency probe to the coplanar waveguide 12 of the substrate-type circulator, it is possible to efficiently and reliably sort a large number of substrate-type circulators before the mounting, for a limited period of time. This simple measurement and evaluation was impossible in the prior art substrate-type circulator mentioned hereinbefore, since no ground electrode is formed on the upper surface of the substrate.

In the substrate-type circulator of this embodiment, since the coplanar waveguide 12 is constituted of the lead-out electrodes 4 and the first ground electrodes 11 by forming the first ground electrodes 11 at the outside of the central electrode pattern 3 and the lead-out electrodes 4 on the same upper surface of the substrate 1 as the surface on which the central electrode pattern 3 and the lead-out electrodes 4 are formed, if a probe having a plurality of contacting terminals or pins located in the same plane is used, it is possible to realize a good electrical contact in the very high frequency region such as the millimeter wave band. Accordingly, since it is possible to easily electrically connect between the substrate-type circulator and a measuring machine, it is possible to precisely and easily measure the electric characteristics with a good repeatability.

In addition, since a plurality of lead-out conductors 4 extending from the central electrode pattern 3 in a plurality of radially outward directions and the first ground electrodes 11 are formed on the upper surface 1a of the substrate 1, the substrate-type circulator is simple in construction, and the electric characteristics can be easily measured.

Second Embodiment

Figure 2:
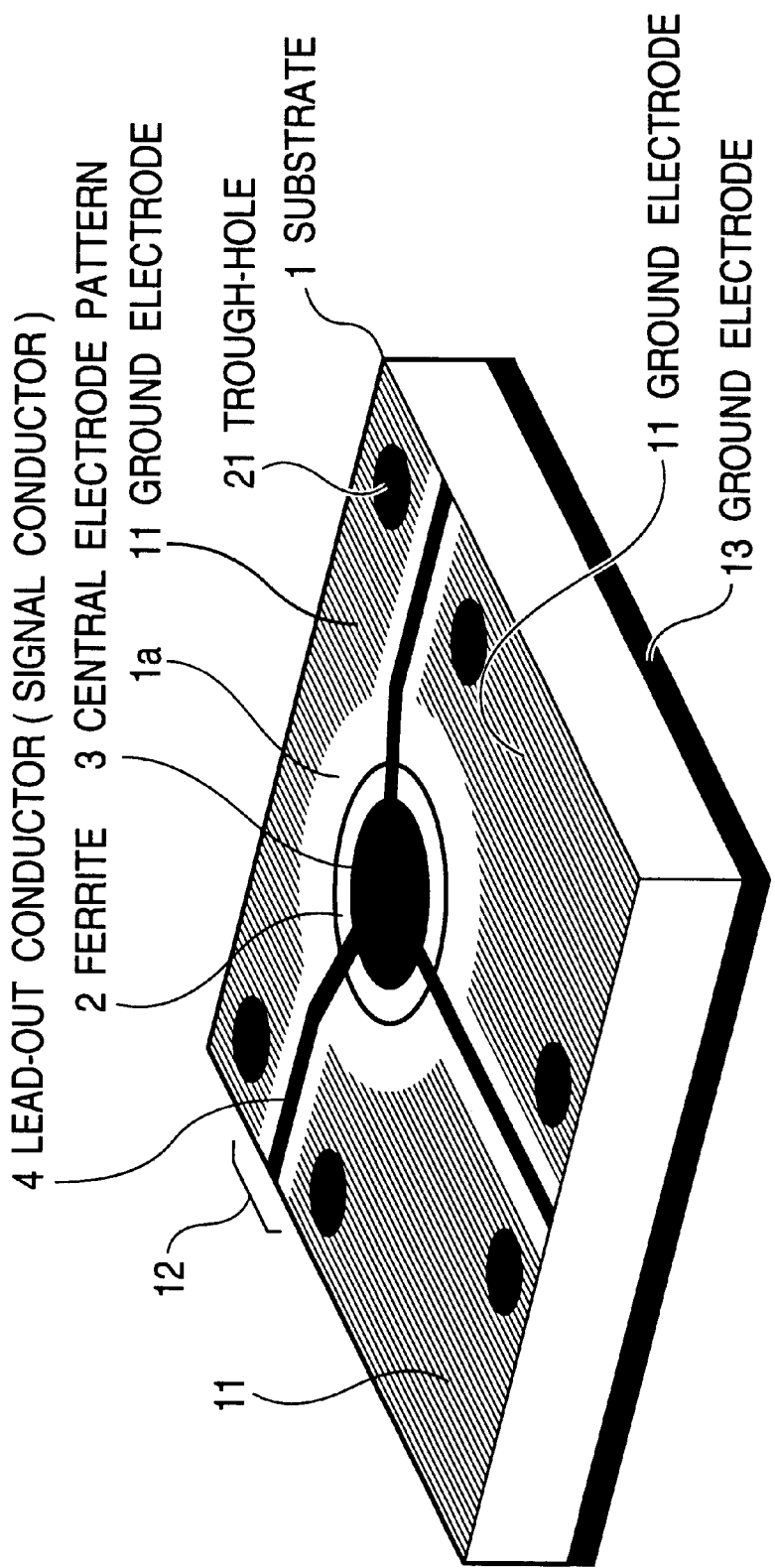
FIG. 2 is a diagrammatic perspective view of a substrate-type circulator which is a second embodiment of the substrate-type non-reciprocal circuit element in accordance with the present invention.

Referring to FIG. 2, there is shown a diagrammatic perspective view of a substrate-type circulator which is a second embodiment of the substrate-type non-reciprocal circuit element in accordance with the present invention. In FIG. 2, elements corresponding to those shown in FIG. 1 are given the same Reference Numerals.

This shown substrate-type circulator includes a substrate 1 formed of a dielectric material and a ferrite 2 in the form of a circular cylinder embedded in the substrate 1. A central electrode pattern 3 is formed on an upper surface of the ferrite 2 which is coplanar with an upper surface of the substrate 1. In addition, a plurality of lead-out conductors (signal conductors) 4 are formed on the upper surface 1a of the substrate 1 to extend from the central electrode pattern 3 in a plurality of radially outward directions. Furthermore, first ground electrodes 11 are formed on the upper surface 1a of the substrate 1 to surround the central electrode pattern 3 and the lead-out conductors 4, separately from the central electrode pattern 3 and the lead-out conductors 4, so that a coplanar waveguide 12 is constituted of the lead-out conductors 4 and the first ground electrodes 11.

In this second embodiment, the first ground electrodes 11 are electrically connected to a second ground electrode 13 formed on a lower surface 1b of the substrate 1 by through-holes 21 formed to penetrate through the substrate 1 from the first ground electrodes 11 to the second ground electrode 13.

As seen from the above, the substrate-type circulator of the second embodiment is the same as the substrate-type circulator of the first embodiment, excepting that the through-holes 21 are used in place of the side surface electrodes 14. Therefore, in the substrate-type circulator of the second embodiment, an advantage similar to that obtained in the substrate-type circulator of the first embodiment can be obtained.

Third Embodiment

Figure 3:
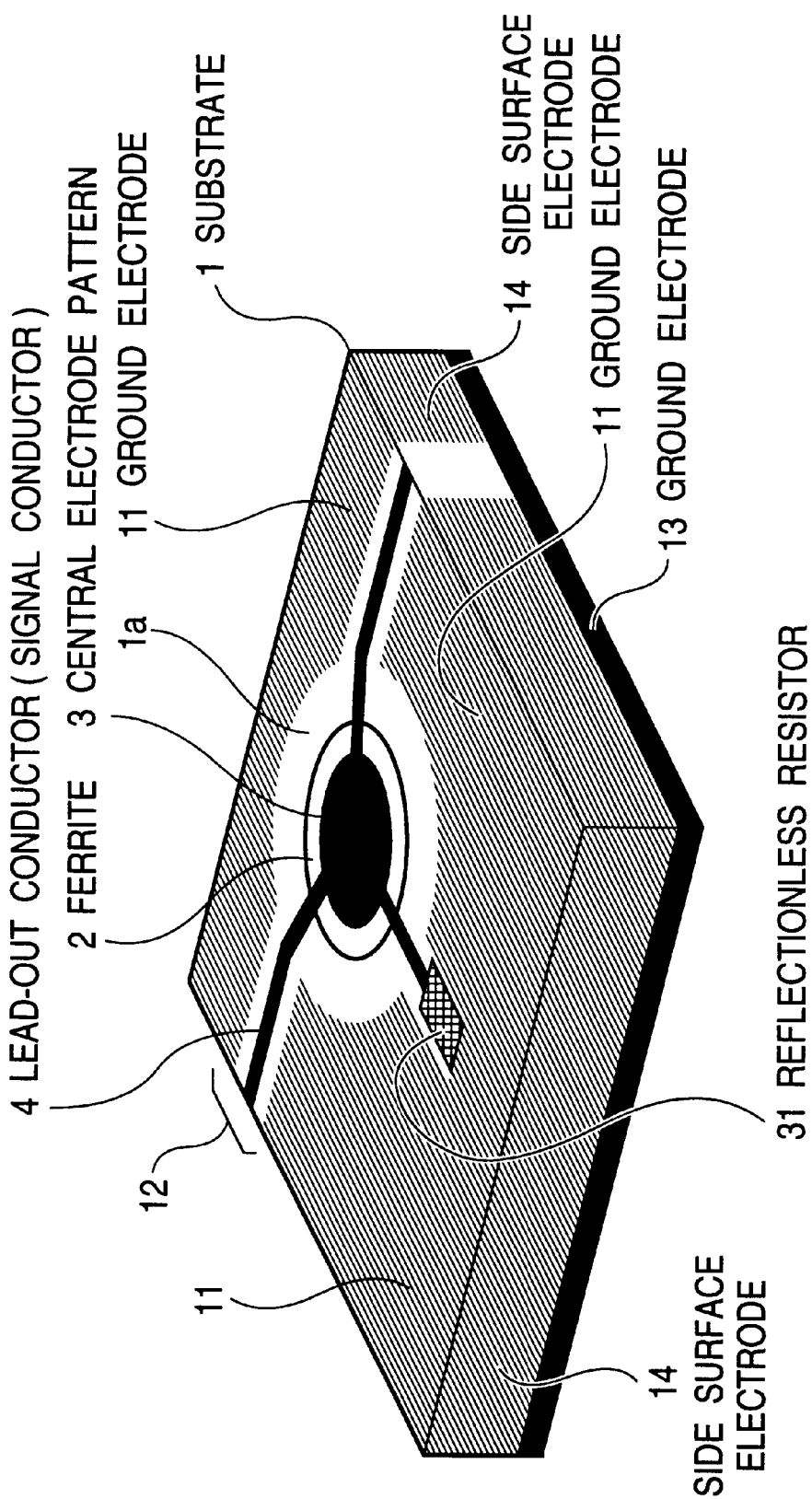
FIG. 3 is a diagrammatic perspective view of a substrate-type isolator which is a third embodiment of the substrate-type non-reciprocal circuit element in accordance with the present invention.

Referring to FIG. 3, there is shown a diagrammatic perspective view of a substrate-type isolator which is a third embodiment of the substrate-type non-reciprocal circuit element in accordance with the present invention. In FIG. 3, elements corresponding to those shown in FIG. 1 are given the same Reference Numerals, and explanation will be omitted.

This shown substrate-type isolator is so constructed that, in the substrate-type circulator of the first embodiment, one of the three lead-out conductors 4, which are three terminals of the substrate-type circulator, is connected to the first ground electrode 11 through a reflectionless resistor 31 formed of for example a thin film on the principal surface of the substrate 1.

In this substrate-type isolator, since the reflectionless resistor 31 is connected to the first ground electrode 11 positioned near to the lead-out conductor 4, a parasite component (inductance and capacitance) can be reduced in comparison with the case that the reflectionless resistor is grounded at the exterior of the substrate 1. Accordingly, this is advantageous to elevate the high frequency characteristics of the isolator. In addition, this substrate-type isolator can realize a good electrical connection between the substrate-type isolator and the evaluation machine in the very high frequency region such as the millimeter wave band, similarly to the substrate-type circulator of the first embodiment. Accordingly, it is possible to precisely and certainly sort a large number of substrate-type isolators for a limited period of time.

Furthermore, since it is possible to evaluate the substrate-type isolator before the mounting, by a simple construction, similarly to the substrate-type circulator of the first embodiment, it is possible to relatively easily obtain a desired high frequency characteristics by repeating the adjustment of the resistance of the reflectionless resistor 31 formed of the thin film, by means of the trimming typified by the laser in trimming, and the evaluation of the electric characteristics of the isolator. If necessary, it is also possible to adjust the resistance while conducting the measurement for the characteristics evaluation.

In this embodiment, the first ground electrode 11 and the second ground electrode 13 are interconnected by the side surface electrodes 14, similarly to the substrate-type circulator of the first embodiment. However, it would be a matter of course that the first ground electrode 11 and the second ground electrode 13 are interconnected by through-boles, similarly to the substrate-type circulator of the second embodiment.

In the substrate-type isolator of this embodiment, since the coplanar waveguide 12 is formed of the lead-out conductor 4 and the first ground electrodes 11 on the same plane, a large number of substrate-type isolators before the mounting, operating in a very high frequency region, can be precisely sorted for a limited period of time, and in addition, the reflectionless resistor 31 formed of the thin film for the isolator can be easily evaluated and adjusted by means of a simple construction.

In connection with the first to third embodiments mentioned above, the shape of the central electrode pattern 3 is not specified, however, any shape can be applied if it is a conventional shape used in the prior an. Furthermore, an external magnet is not shown in the drawings and is not described in the above explanation, however, it is a matter of course to persons skilled in the art that the external magnet can be located above or under the substrate-type circulator or isolator, or can be embedded in the substrate 1. In addition, if the ferrite 2 is formed of a hard ferrite material, since the external magnet becomes unnecessary, the circulator and the isolator can be further miniaturized.

Fourth Embodiment

Figure 4:
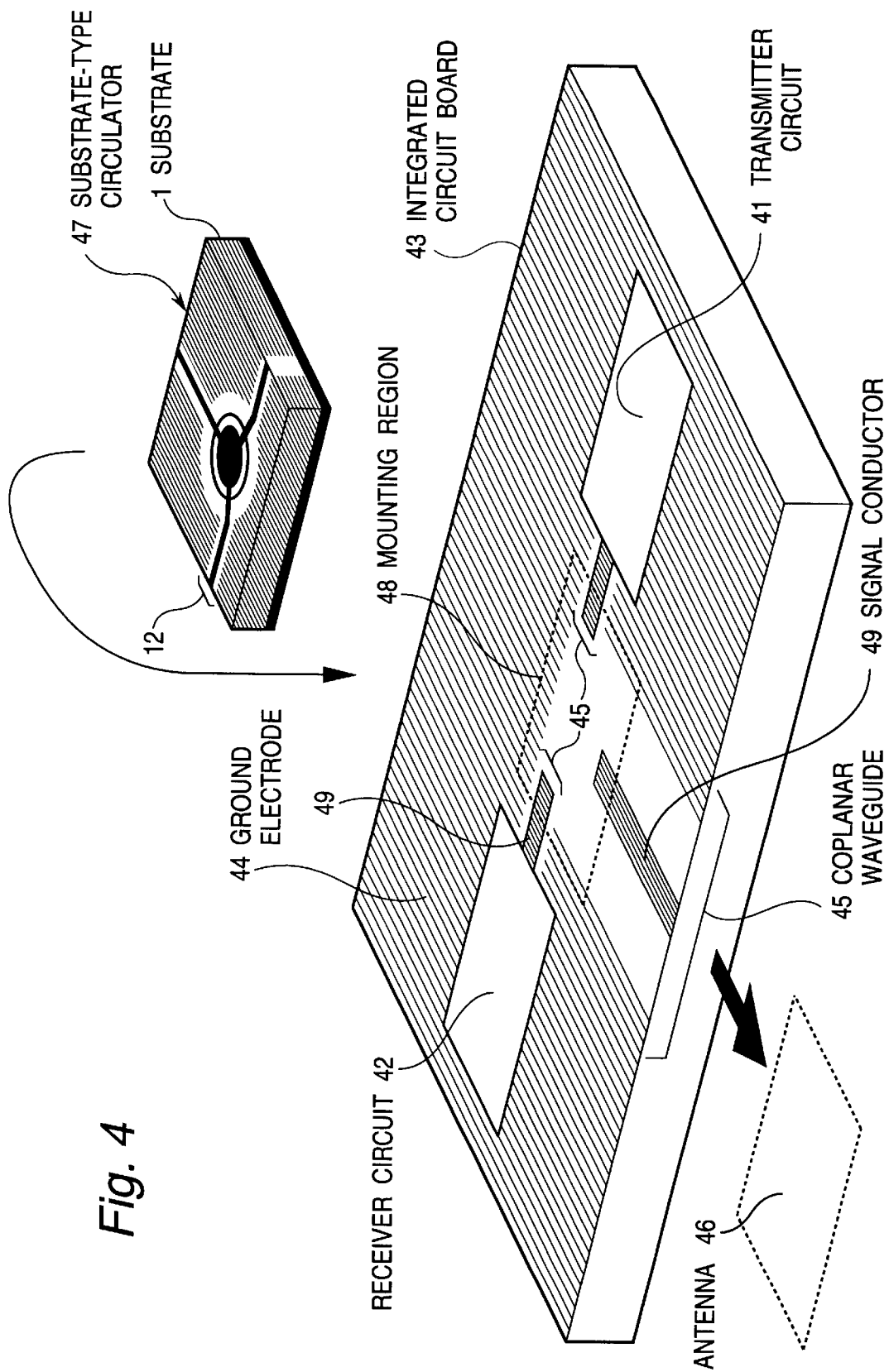
FIG. 4 is a diagrammatic perspective view of one embodiment of the integrated circuit in accordance with the present invention using the substrate-type non-reciprocal circuit element in accordance with the present invention.

Referring to FIG. 4, there is shown a diagrammatic perspective view of one embodiment of the integrated circuit in accordance with the present invention using the substrate-type non-reciprocal circuit element in accordance with the present invention.

The shown integrated circuit includes an integrated circuit board 43 on which a transmitter circuit 41 and a receiver circuit 42 are formed. A mounting region 48, on which a substrate-type circulator 47 is to be mounted, is confined on an upper surface of the integrated circuit board 43 between the transmitter circuit 41 and the receiver circuit 42 and separately from each of the transmitter circuit 41 and the receiver circuit 42. In addition, three signal conductors 49 are formed on the upper surface of the integrated circuit board 43 in such a manner that, a first one of the three signal conductors 49 extends straight from the transmitter circuit 41 to the mounting region 48, a second one of the three signal conductors 49 extends straight from the receiver circuit 42, to the mounting region 48, and a third one of the three signal conductors 49 extends straight from the mounting region 48 to an edge of the substrate 43 to be connected to an antenna 46. A ground electrode 44 is formed on the upper surface of the integrated circuit board 43 other than the transmitter circuit 41, the receiver circuit 42 and the signal conductors 49, separately from the three signal conductors 49 but to partially overlap with a periphery of the mounting region 48, so that three coplanar waveguides 45 are formed by the three signal conductors 49 and the ground electrode 44 surrounding each of the three signal conductors 49, separately from the three signal conductors 49. In this embodiment, the substrate-type circulator 47 is either the substrate-type circulator of the first embodiment or the substrate-type circulator of the second embodiment.

Figure 5:
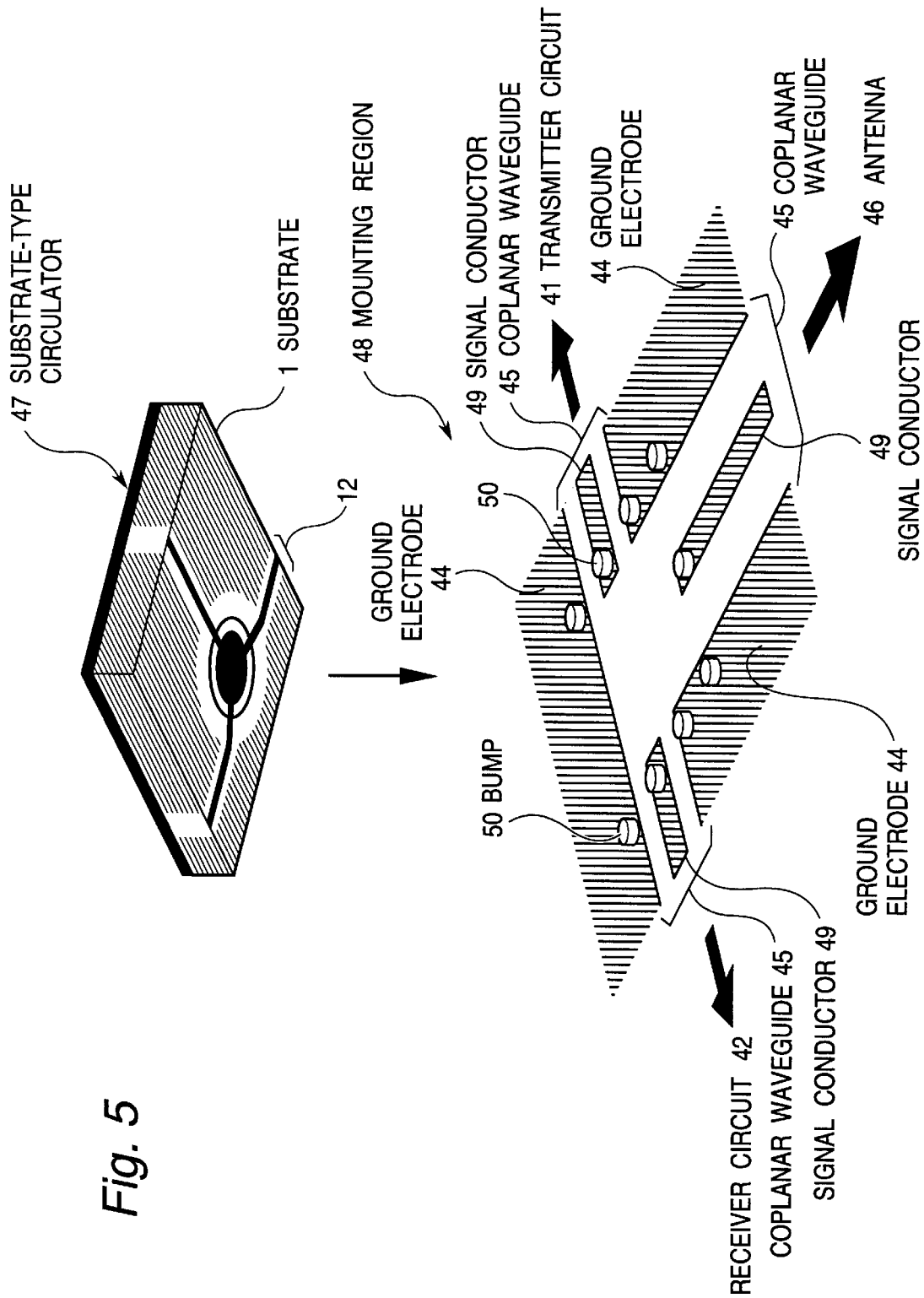
FIG. 5 is an enlarged diagrammatic perspective view for illustrating the mounting region of the integrated circuit board and the substrate-type circulator to be mounted on the mounting region, in the integrated circuit shown in FIG. 4.

FIG. 5 is an enlarged diagrammatic perspective view for illustrating the mounting region 48 of the integrated circuit board 43 and the substrate-type circulator 47 to be mounted on the mounting region 48. As shown in FIG. 5, bumps 50 formed of for example Au are formed on the signal conductors 49 and the ground electrode 44 within the mounting region 48. On the other hand, the substrate-type circulator 47 is positioned to have the surface of the coplanar waveguide 12 faced to the mounting region 48 (namely, the upper surface of the substrate 43), and then, is mounted on the mounting region 48. This mounting can be realized by a method used in a flip chip mounting method, for example, a thermocompression bonding, a heat-fusion bonding, or a method utilizing a shrinkage of an organic material.

In the substrate-type circulator 47 of this embodiment, since the coplanar waveguide 12 is formed on the surface of the substrate 1, the signal conductors and the ground electrode of the coplanar waveguide 12 can be connected to the signal conductors 49 and the ground electrode 44 of the coplanar waveguide 45 formed on the integrated circuit board 43, respectively, by means of the bumps 50 with an extremely short connection distance which is sufficiently smaller than 100 $\mu$m. Therefore, the transmission loss itself and the variation in the transmission loss can be minimized, so that the substrate-type circulator can be connected to the transmitter circuit and the receiver circuit with a minimized loss.

Incidentally, the integrated circuit board 43 can be formed of a dielectric material substrate which is conventionally used in the prior art, but may be formed of a semiconductor substrate.

Fifth Embodiment

Figure 6:
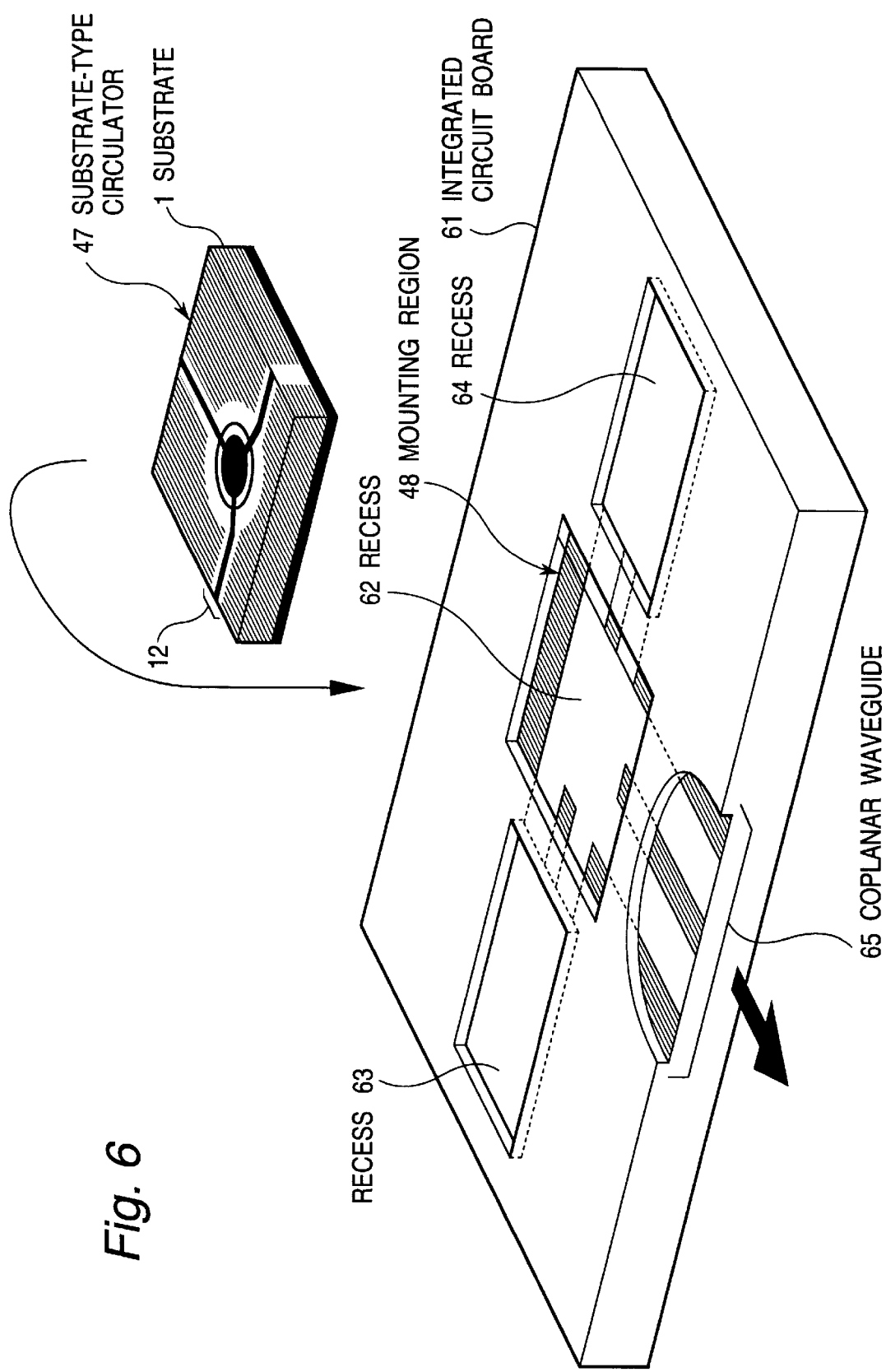
FIG. 6, there is shown a diagrammatic perspective view of another embodiment of the integrated circuit in accordance with the present invention using the substrate-type non-reciprocal circuit element in accordance with the present invention.
Figure 7:
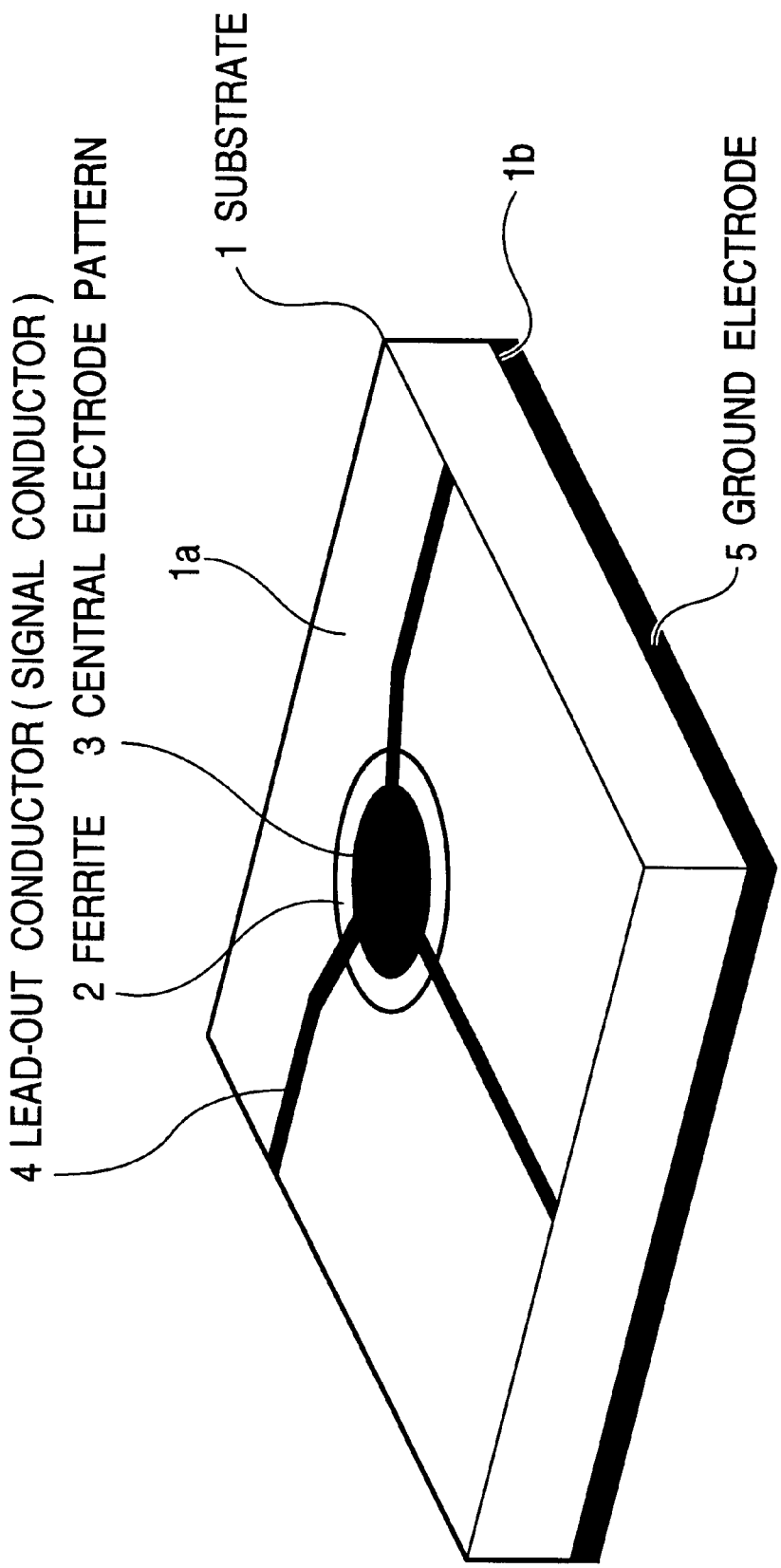
FIG. 7 is a diagrammatic perspective view illustrating the prior art substrate-type circulator.

Referring to FIG. 6, there is shown a diagrammatic perspective view of another embodiment of the integrated circuit in accordance with the present invention using the substrate-type non-reciprocal circuit element in accordance with the present invention.

The shown integrated circuit includes an integrated circuit board 61 having a recess 62 in which a substrate-type circulator 47 is to be accommodated. The integrated circuit board 61 also has a recess 63 in which a transmitter circuit chip or substrate is to be accommodated, and a recess 64 in which a receiver circuit chip or substrate is to be accommodated. On the bottom of the recess 62, a mounting region 48 similar to the mounting region 48 of the fourth embodiment is formed. Thus, the substrate-type circulator 47 is mounted on the mounting region 48 in such a condition that the surface of the coplanar waveguide 12 is faced to the mounting region 48 in the bottom of the recess 62. Interconnection between the recesses 62, 63 and 64 and interconnection to an external are realized by a coplanar waveguide 65 formed in the inside of the integrated circuit board 61.

In the integrated circuit of this embodiment, the transmission loss in the interconnections between the circuit chips or substrates and between the circuit element and the circuit chips or substrates can be minimized, and also, the variation in the transmission loss can be minimized. In addition, if the recesses 62, 63 and 64 accommodating the circuit element and the circuit chips or substrates, respectively, are covered with a lid, an air-tight structure can be easily obtained. If the lid is formed of an electrically conductive material, each of the recesses 62, 63 and 64 can be electromagnetically shielded.

The number of the recesses 62 to 64 is not limited to the number in the shown embodiment, but any number of recesses can be formed. In any case, it is possible to cause the recesses to accommodate the transmitter circuit chip, the receiver circuit chip, and a chip or substrate on which there is formed a portion or all of a circuit required to operate the transmitter circuit and the receiver circuit.

In the fourth and fifth embodiments, the substrate-type circulator 47 is used as the substrate-type non-reciprocal circuit element. However, it would be a matter of course to persons skilled in the art that the substrate-type isolator of the third embodiment can be used in place of the substrate-type circulator 47.

In addition, in the fourth and fifth embodiments, an external magnet has not been explained. However, it would also be a matter of course to persons skilled in the art that the external magnet can be located under a rear surface of the integrated circuit board 43 or 61, or above the substrate-type circulator 47 or the substrate-type isolator, or can be embedded in the substrate of the substrate-type circulator or isolator. In addition, if the ferrite is formed of a hard ferrite material, the external magnet becomes unnecessary. Furthermore, if the substrate-type circulator or isolator including the ferrite formed of a hard ferrite material is used in the integrated circuit of the fifth embodiment, it is possible to easily realize a small-sized integrated circuit having the integrated circuit board 61 of an air-tight internal structure.

As mentioned above, in the substrate-type non-reciprocal circuit element in accordance with the present invention, since the plurality of conductors extending from the central electrode in the plurality of different directions and the first ground electrode are formed on one principal surface of the substrate, if the probe having a plurality of contacting terminals located in the same plane is used, it is possible to realize a good electrical contact between the probe and the substrate-type non-reciprocal circuit element in a very high frequency region such as the millimeter wave band.

Therefore, since the substrate-type non-reciprocal circuit element can be easily electrically connected to a measurement machine, an electrical characteristics can be precisely and easily measured with a good repeatability.

In addition, since the plurality of conductors extending from the central electrode in the plurality of different directions and the first ground electrode are formed on one principal surface of the substrate, the substrate-type non-reciprocal circuit element is simple in construction.

Furthermore, in the integrated circuit in accordance with the present invention, since the signal conductors and the ground electrode are formed on the one principal surface of the substrate of the substrate-type non-reciprocal circuit element, the signal conductors and the ground electrode of the substrate-type non-reciprocal circuit element can be connected to the signal conductors and the ground electrode of the coplanar waveguide formed on the integrated circuit board, respectively, by means of the bumps with an extremely short connection distance. Therefore, when the substrate-type non-reciprocal circuit element is connected to an electric circuit such as the receiver circuit and the transmitter circuit, the transmission loss itself and the variation in the transmission loss can be minimized.

The invention has thus been shown and described with reference to the specific embodiments. However, it should be noted that the present invention is in no way limited to the details of the illustrated structures but changes and modifications may be made within the scope of the appended claims.

What is claimed is:

1. A substrate type non-reciprocal circuit element having a plurality of signal conductors and so configured that a signal inputted through one signal conductor is outputted from another signal conductor, the substrate-type non-reciprocal circuit element comprising:

a substrate;

a ferrite embedded in said substrate;

a central electrode formed on said ferrite at one principal surface of said substrate;

a plurality of signal conductors formed on said one principal surface of said substrate to extend from said central electrode into a plurality of different outward directions;

a first ground electrode formed on said one principal surface of said substrate; and a second ground electrode formed on a second principal surface of said substrate and electrically connected to said first ground electrode, said second principal surface being opposite said first principal surface, such that said first ground electrode is separated from said central electrode and said plurality of signal conductors, said first ground electrode being formed at opposite sides of each of said signal conductors, separately from each of said signal conductors so as to form a coplanar waveguide comprising said signal conductor, said first ground electrode, and said second ground electrode.

2. A substrate-type non-reciprocal circuit element claimed in claim 1 further including a reflectionless resistor located at the side of said one principal surface of said substrate and connected between one of said signal conductors and said first ground electrode.

3. A substrate-type non-reciprocal circuit element claimed in claim 2 wherein said second ground electrode is electrically connected to said first ground electrode by a side surface electrode formed on a side surface of said substrate.

4. A substrate-type non-reciprocal circuit element claimed in claim 2 wherein said second ground electrode is electrically connected to said first ground electrode by through-holes formed to penetrate through said substrate from said first ground electrode to said second ground electrode.

5. A substrate-type non-reciprocal circuit element of claim 1, wherein said ferrite embedded in said substrate is formed of a hard ferrite material whereby the substrate-type non-reciprocal circuit element operates as a non-reciprocal circuit without an external magnet.

6. A substrate-type non-reciprocal circuit element claimed in claim 1, wherein said second ground electrode is electrically connected to said first ground electrode by a side surface electrode formed on a side surface of said substrate.

7. A substrate-type non-reciprocal circuit element claimed in claim 1, wherein said second ground electrode is electrically connected to said first ground electrode by through-holes formed to penetrate through said substrate from said first ground electrode to said second ground electrode.

8. A substrate type non-reciprocal circuit element having a coplanar external electrical circuit interface, said circuit element having a plurality of signal conductors and so configured that a signal inputted through one of said signal conductors is outputted from another of said signal conductors, the substrate-type non-reciprocal circuit element comprising:

a substrate;

a ferrite embedded in said substrate;

a central electrode formed on said ferrite at a first principal surface of said substrate;

a plurality of signal conductors formed on said first principal surface of said substrate to extend from said central electrode into a plurality of different outward directions; and a first ground electrode formed on said first principal surface of said substrate, separately from said central electrode and said plurality of signal conductors, said first ground electrode being formed on opposite sides of each of said signal conductors, separately from each of said signal conductors so as to form a coplanar external electrical circuit interface on said first principal surface, wherein said coplanar external electrical circuit interface comprises a plurality of flip chip contacts on said first principle surface, thereby providing the capability to simultaneously interface with said first ground electrode and at least one of said signal conductors through an electrical connection comprising a corresponding plurality of flip chip contacts mounted on a planar surface, wherein said planar surface is essentially adjacent to said first principle surface when making said coplanar external electrical circuit interface, being separated by a distance defined by said plurality of flip chip contacts.

9. The substrate type non-reciprocal circuit element of claim 8, wherein said coplanar external circuit interface provides an electrical interface to a coplanar type high frequency probe having a plurality of pins located on a same plane, thereby providing a rapid and precise method for testing said substrate type non-reciprocal circuit element.

10. The substrate type non-reciprocal circuit element of claim 8, wherein said coplanar external circuit interface provides an electrical interface to a coplanar type high frequency probe having a plurality of pins located on a same plane, thereby providing a rapid and precise method for adjusting electrical characteristics of substrate type non-reciprocal circuit element.

11. The substrate type non-reciprocal circuit element of claim 8, wherein said coplanar external circuit interface provides an electrical interface to a coplanar type high frequency probe having a plurality of pins located on a same plane, thereby providing a rapid and precise method for adjusting electrical components mounted on said one principal surface of said substrate type non-reciprocal circuit element.

12. The substrate type non-reciprocal circuit element of claim 8, wherein said coplanar external circuit interface provides an electrical interface to a coplanar circuit board, thereby providing a direct contact between said signal conductor used for said input signal, said signal conductor used for said output signal, and said first ground electrode mounted on said one principal surface of said substrate type non-reciprocal circuit with a set of predetermined respective corresponding electrical contact points on said coplanar circuit board.

13. A substrate-type non-reciprocal circuit element of claim 8, wherein said ferrite embedded in said substrate is formed of a hard ferrite material whereby the substrate-type non-reciprocal circuit element operates as a non-reciprocal circuit without an external magnet.

14. The substrate type non-reciprocal circuit element of claim 8, further comprising:

a second ground electrode formed on a second principal surface opposite to said first principal surface, wherein said second ground electrode and said first ground electrode are electrically connected.

15. The substrate type non-reciprocal circuit element of claim 14, wherein each of said plurality of signal conductors forms a waveguide in combination with said first ground electrode and said second ground electrode.

16. An integrated circuit comprising an integrated circuit board and a substrate-type non-reciprocal circuit element having a plurality of signal conductors and so configured that a signal inputted through one signal conductor is outputted from another signal conductor, said substrate-type non-reciprocal circuit element comprising:

a substrate;

a ferrite embedded in said substrate;

a central electrode formed on said ferrite at one principal surface of said substrate;

a plurality of signal conductors formed on said one principal surface of said substrate to extend from said central electrode into a plurality of different outward directions;

a first ground electrode formed on said one principal surface of said substrate, separately from said central electrode and said plurality of signal conductors, said first ground electrode being formed at opposite sides of each of said signal conductors, separately from each of said signal conductors; and a second ground electrode formed on a second principal surface of said substrate, said second ground electrode electrically connected to said first ground electrode such that a coplanar waveguide is respectively formed by each of said signal conductors, each said coplanar waveguide comprising one of said signal conductors in combination with said first ground and said second ground, wherein said substrate-type non-reciprocal circuit element is electrically connected to said integrated circuit board in a flip chip method.

17. An integrated circuit of claim 16, wherein said ferrite embedded in said substrate is formed of a hard ferrite material whereby said substrate-type non-reciprocal circuit element operates as a non-reciprocal circuit without an external magnet.

18. An integrated circuit claimed in claim 16, wherein said second ground electrode is electrically connected to said first ground electrode by a side surface electrode formed on a side surface of said substrate.

19. An integrated circuit claimed in claim 16, wherein said second ground electrode is electrically connected to said first ground electrode by through-holes formed to penetrate through said substrate from said first ground electrode to said second ground electrode.

20. An integrated circuit claimed in claim 16, wherein said integrated circuit board includes at least one coplanar waveguide formed internal to said integrated circuit board and said substrate-type non-reciprocal circuit element is accommodated in a recess formed in said integrated circuit board, said recess allowing at least one said coplanar waveguide on said substrate-type non-reciprocal circuit element to interface with at least one of said at least one internal coplanar waveguide.

21. The integrated circuit of claim 20, further comprising a lid formed of an electrical conductive material providing an electromagnetic shield for said recess.

22. The integrated circuit of claim 20, further comprising a lid, thereby forming an airtight structure for said recess.

23. An integrated circuit claimed in claim 16, wherein said substrate-type non-reciprocal circuit element further includes a reflectionless resistor located at the side of said one principal surface of said substrate and connected between one of said signal conductors and said first ground electrode.

24. A substrate type non-reciprocal circuit element having at least one coplanar waveguide on a first surface, said circuit element having a plurality of signal conductors and so configured that a signal inputted through one signal conductor is outputted from another signal conductor, the substrate-type non-reciprocal circuit element comprising:

a substrate;

a ferrite embedded in said substrate;

a central electrode formed on said ferrite on said first surface of said substrate;

a plurality of signal conductors formed on said first surface of said substrate to extend from said central electrode into a plurality of different outward directions; and a first ground electrode formed on said first surface of said substrate such that said first ground electrode is separated from said central electrode and said plurality of signal conductors, said first ground electrode being formed on said first surface on opposite sides of said central electrode and each of said signal conductors at a separation such as to form a coplanar waveguide comprising said first ground electrode and at least one of said signal conductors.

25. The substrate type non-reciprocal circuit element of claim 24, further comprising:

a second ground electrode formed on a second surface of said substrate, said second surface being opposite said first surface, said second ground electrode covering an entire surface area of said second surface.

26. A The substrate type non-reciprocal circuit element of claim 25, wherein said first ground electrode and said second ground electrode are electrically interconnected.

27. The substrate type non-reciprocal circuit element of claim 25, wherein a dimension separating said first ground electrode and said second ground electrode causes formation of at least one conductor-backed coplanar waveguide, said conductor-backed coplanar waveguide comprising said first ground electrode, said second ground electrode, and at least one of said plurality of signal conductors.

* * * * *